(12) United States Patent
Hsu et al.

(10) Patent No.: US 6,221,786 B1
(45) Date of Patent: Apr. 24, 2001

(54) METHODS FOR ISOLATING INTERCONNECTS

(75) Inventors: Shih-Chi Hsu, Chung-Li; Tse Yao Huang, Taipei, both of (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 09/213,425

(22) Filed: Dec. 17, 1998

(30) Foreign Application Priority Data

Oct. 26, 1998 (TW) .................................. 87117696

(51) Int. Cl.$^7$ ............................................. H01L 21/3063
(52) U.S. Cl. ........................ 438/745; 438/750; 438/753; 438/754
(58) Field of Search .................................. 438/689, 745, 438/754, 421, 422, 411, 412, 619, 620; 257/254, 522

(56) References Cited

U.S. PATENT DOCUMENTS

| | | | | |
|---|---|---|---|---|
| 5,141,896 | * | 8/1992 | Katoh .................................... | 438/619 |
| 5,510,645 | * | 4/1996 | Fitch et al. ............................ | 257/522 |
| 5,559,055 | * | 9/1996 | Chang et al. .......................... | 438/586 |
| 5,759,913 | * | 6/1998 | Fulford et al. ........................ | 438/624 |
| 5,782,984 | * | 7/1998 | Lim et al. ................................ | 134/2 |
| 5,783,864 | * | 7/1998 | Dawson et al. ..................... | 257/758 |
| 5,968,851 | * | 10/1999 | Geha et al. ........................... | 438/756 |

* cited by examiner

Primary Examiner—Benjamin L. Utech
Assistant Examiner—Lan Vinh
(74) Attorney, Agent, or Firm—Michael D. Bednarek; Shaw Pittman

(57) ABSTRACT

This present invention provides methods for isolating interconnects characterized by first isolating the top and bottom interconnects with an IMD consisting of a traditional low-k dielectric material, then dissolving the low-k material with a suitable solvent and using air or a noble gas instead of the traditional low-k dielectric material to isolate the interconnects.

17 Claims, 8 Drawing Sheets

METHODS FOR ISOLATING INTERCONNECTS

FIELD OF THE INVENTION

This invention relates to methods for isolating interconnects. In particular, it relates to methods for isolating interconnects by means of air instead of traditional low-k dielectric materials.

BACKGROUND OF THE INVENTION

With the increasing integration of ICs, chips can not provide an enough surface area to produce interconnects. Therefore, the multiple metal layers design rule is provided to produce interconnects of MOS transistors with narrowed-down line-width, especially in products with complex functions. For example, four or five metal layers used to connect devices are present in a microprocessor.

The multiple-interconnects are formed when the MOS is finished; therefore, the process for producing multiple-interconnects can be viewed as an independent semiconductor process. Among the multiple interconnects, the orientations of two independent interconnects are crossed-over each other; moreover, a dielectric layer isolating two independent interconnects is used to avoid shorts resulting from the contact of independent interconnects. The dielectric layer used to isolate interconnects is also known as the inter-metal dielectric (IMD) layer. In addition, the independent interconnects can be conducted by a traditional plug. As shown in FIG. 1A and FIG. 1B, a substrate 100 comprising a number off semiconductor devices was provided first. Then, a low-k insulating layer 110, i.e. a silicon oxide layer, was formed over the substrate 100. Subsequently, an interconnect 120 consisting of a plurality of metal lines isolated from each other was formed over the insulating layer 110 by a traditional metallization process. Then, another interconnect 130 consisting of a plurality of metal lines with an orientation crossing-over the interconnect 120 was formed over the insulating layer 130. By means of the method described above, the interconnects 120 and 140 were isolated by the low-k insulating layer 110.

The dielectric materials suitable for application in the isolation process as described above include silicon oxide (with a dielectric constant 4~5), TEOS (with a dielectric constant 4~5), silicon nitride (with a dielectric constant 6~9), silicon nitroxide, phosphorus silicon glass (PSG) and boron-phosphorus silicon glass (BPSG). During the 0.32 μm process, the average dielectric constant of dielectric materials described above is about 4. In order to reduce the increasing RC-delay effect resulting from the narrowing distance between interconnects, it is necessary to develop a novel method for isolating the interconnects by using a low-k material (k<3).

SUMMARY OF THE INVENTION

In order to provide a low-k dielectric layer for isolating the interconnects, the present invention uses air instead of the traditional low-k dielectric materials to isolate the interconnects.

The feature of the invention is providing a method for isolating interconnects, the steps comprising: providing a substrate; forming a first insulating layer over the substrate; forming a first interconnect over the first insulating layer; forming a first stop layer overlying over the first interconnect and the first insulating layer; forming a second insulating layer over the first stop layer; forming a photoresist pattern layer over the second insulating layer; using the photoresist pattern layer as a mask and etching the exposed second insulating layer to the first stop layer to define two bridge-supporting structures beside the first interconnect; forming a second stop layer overlying over the first stop layer and the bridge supporting structures; forming an intermetal-dielectric layer with a thickness more than that of the bridge-supporting structures over the second insulating layer; applying a planarization treatment by etching back the intermetal-dielectric layer to the second stop layer on the bridge-supporting structures; forming a third stop layer over the second inter-metal dielectric layer; forming a second interconnect over the third stop layer, wherein the orientation of the second interconnect crosses-over the first interconnect; forming a passivation layer overlying the second interconnect and the third stop layer; defining at least one channel through the passivation layer, the third stop layer, the second layer and exposing the inter-metal dielectric layer; dissolving the inter-metal dielectric layer completely with a suitable solvent through the channel to form a chamber for isolating the first and second interconnects.

In the isolation method described above, the first and the second insulating layers are selected from the group consisting of silicon oxide, TEOS, SOG, BPSG and PSG. The first interconnect and the second interconnect can consist of aluminum, copper, Al—Cu alloy or Al—Cu—Si alloy. The inter-metal dielectric layer (IMD) consists of a low-k dielectric material, such as silicon oxide, TEOS, PSG and BPSG. The first insulating layer, the second insulating layer, the third insulating layer and the passivation layer can consist of silicon nitride ($Si_3N_4$) or silicon oxynitride ($SiO_xN_y$). Moreover, an extra drying step can be performed to evaporate the water and solvent in the chamber after the inter-metal dielectric layer is dissolved completely by the suitable solvent, then sealing the channel. In addition, an inert gas such as nitrogen or a noble gas can be directed into the chamber before the channel is sealed.

Other features and advantages of the invention will be apparent from the following detailed description, and from the claims.

DETAILED DESCRIPTION OF THE INVENTION

Figure 1A:
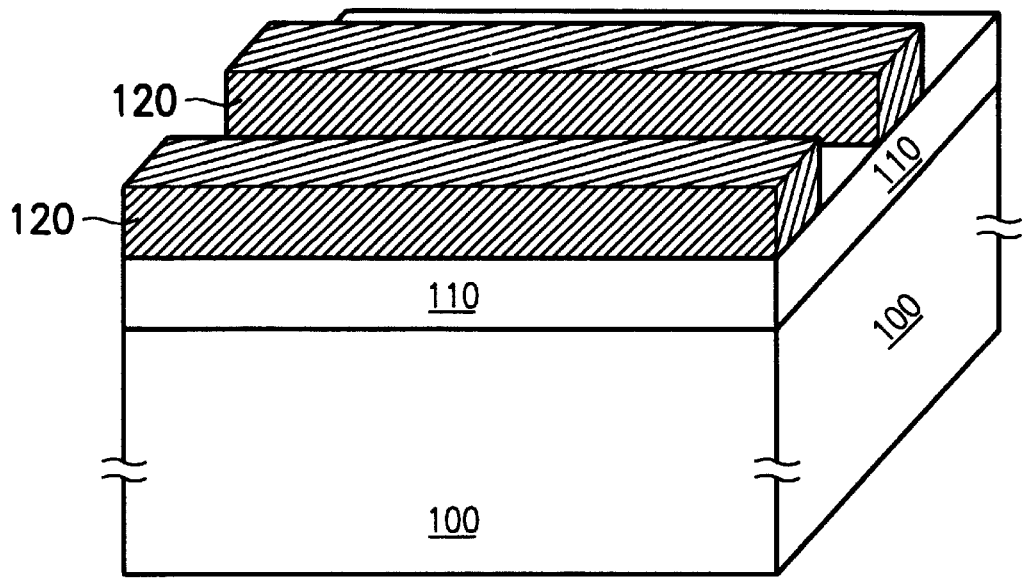
FIGS. 1A~1B are 3-D cross-sectional figures showing a traditional isolation process for interconnects by means of a low-k inter-metal dielectric layer.
Figure 1B:
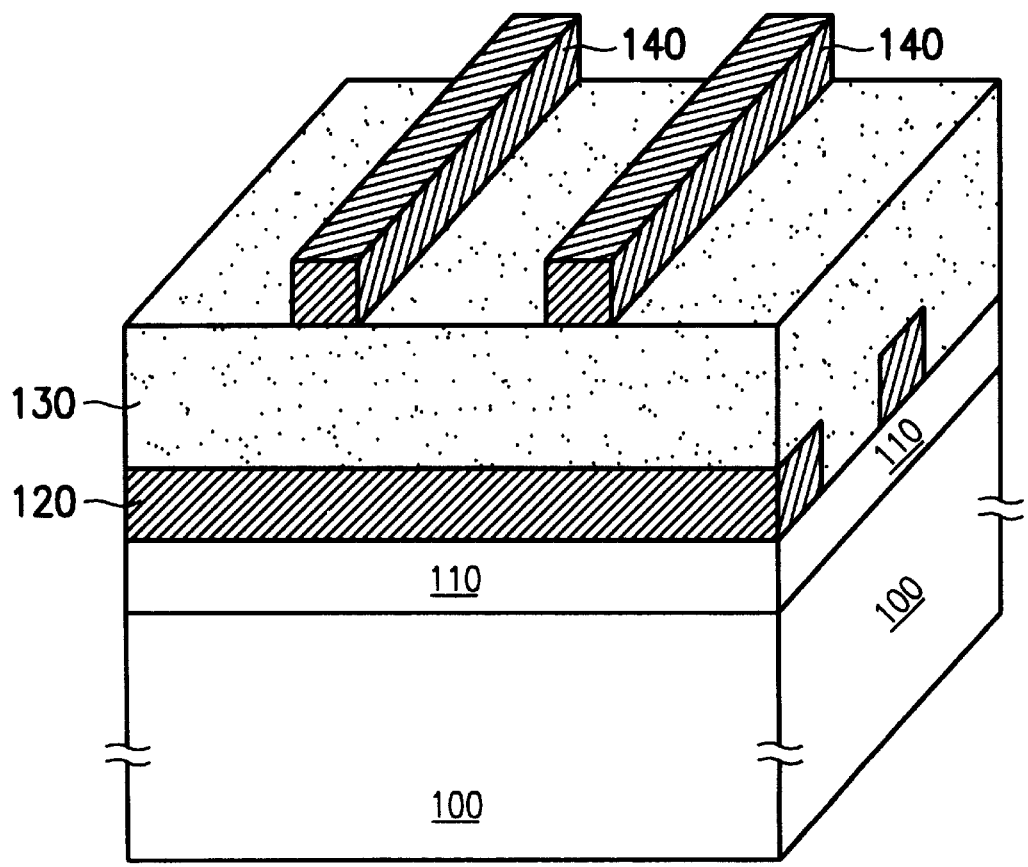

The present invention provides a novel method for isolating interconnects characterized by replacing the traditional dielectric materials by air or an inert gas such as nitrogen or a noble gas.

According to the present invention, a substrate is provided first, wherein the substrate can further comprise a number semiconductor devices. Next, a first insulating layer consisting of silicon oxide, TEOS, SOG BPSG, or BPSG, is formed over the substrate. Subsequently, a first set of interconnects separated from each other are formed over the first insulating layer by means of the traditional metallization process.

A first stop layer consisting of silicon nitride or silicon oxynitride is formed overlying the first interconnects and the first insulating layer.

A second insulating layer consisting of silicon oxide, TEOS, SOG, BPSG, or PSG, is formed over the stop layer. A photoresist pattern layer is formed over the second insulating layer to define bridge-supporting structures.

Using the photoresist pattern layer as a mask, the exposed second insulating layer and the first stop layer underline are removed by means of dry etching. Then, two bridge supporting structures are formed beside the first interconnects.

The photoresist pattern layer is removed first, then a second stop layer is formed overlying the first stop layer and the bridge supporting structures formed in the previous step. Subsequently, an inter-metal dielectric layer consisting of silicon oxide, PSG, BPSG, or PSG with a thickness greater than that of the bridge supporting structures is formed over the second stop layer. Then, a planarization treatment is applied by means of chemical mechanical polish (CMP) to remove excess portion of the inter-metal layer to the second stop layer on the second insulating layer.

Then, a third stop layer is formed over the planarized inter-metal dielectric layer. A second set of interconnects separated from each other with an orientation crossing-over the first interconnects are formed over the second stop layer by means of the traditional metallization process. Subsequently, a passivation layer is formed overlying the second interconnects and the third stop layer.

At least one channel through the passivation layer, the third stop layer, the second stop layer and exposing the inter-metal dielectric layer is formed within the area between the two bridge supporting structures beside the first interconnects. The diameter of the channel depends on the line-width of semiconductor devices. Subsequently, a suitable solvent (i.e. dilute hydrogen fluoride; DHF), is directed into the channel to dissolve the inter-metal dielectric layer completely and thereby form a chamber The previous inter-metal dielectric layer consisting of traditional low-k dielectric material is replaced by air with a dielectric constant of 1.004, which is lower than any known low-k dielectric material.

Moreover, an extra drying treatment by means of high-temperature baking can be applied to evaporate the moisture and solvent after the inter-metal dielectric layer is removed completely by the DHF. Subsequently, a sealing process is applied after the drying treatment is finished. Alternately, an extra inert gas, i.e. nitrogen or a noble gas, can be directed into the chamber through the channels to replace air after the drying treatment applied by high-temperature baking, followed by sealing the channels by according to the traditional process.

According to the isolation method described above, the traditional low-k dielectric material can be replaced by either air or an inert gas after the low-k dielectric material is removed completely by a suitable solvent. Thus, a novel dielectric layer with a dielectric constant of about 1 can be obtained. The novel dielectric layer not only isolates the interconnects, but also reduces the RC-delay effect.

Embodiment

Figure 2A:
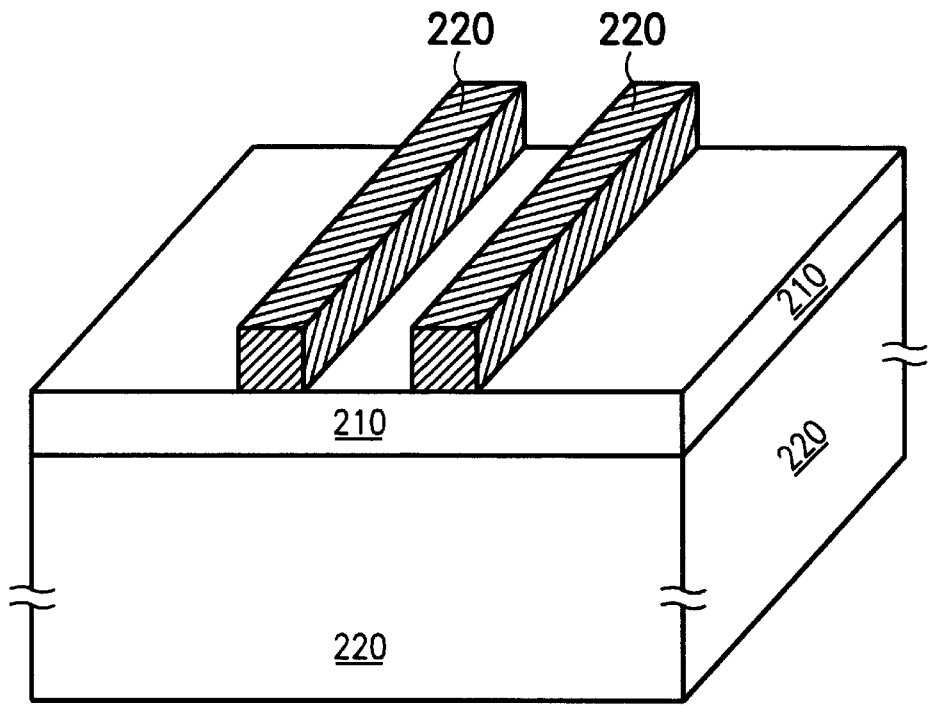
FIGS. 2A~2H are 3-D cross-sectional figures showing the process of the preferred embodiment according to the present invention.
Figure 2B:
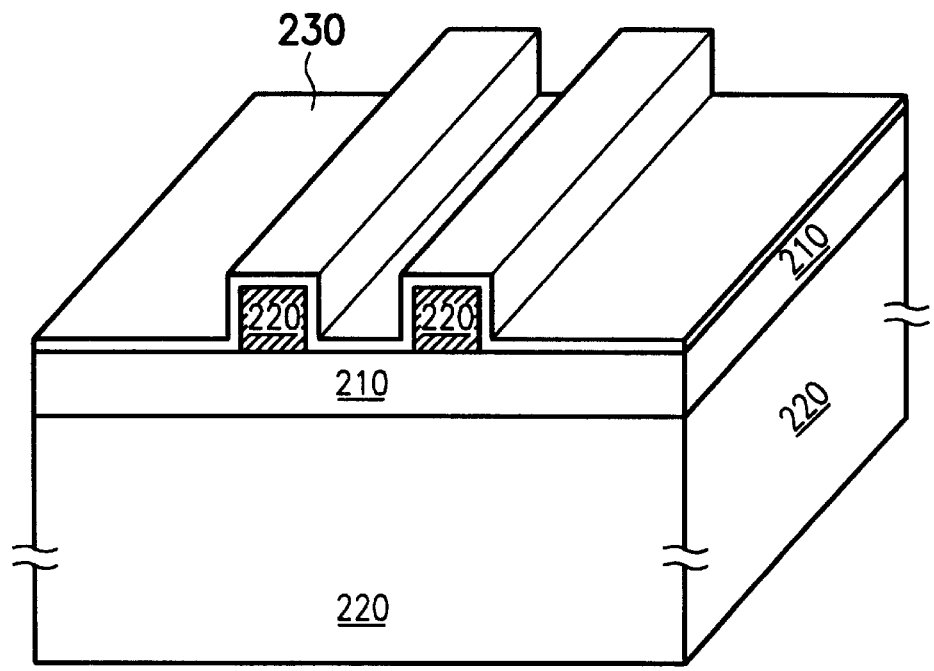

Referring to FIG. 2A, a substrate 200 was provided (the substrate 200 could further comprise other semiconductor devices not shown in the drawing). Then, an insulating layer 210, i.e. boron-phosphorus silicon glass (BPSG), was formed over the substrate 200. Subsequently, a plurality of interconnects 220 were formed separated from each other over the BPSG 210 by means of the traditional metallization process.

Figure 2C:
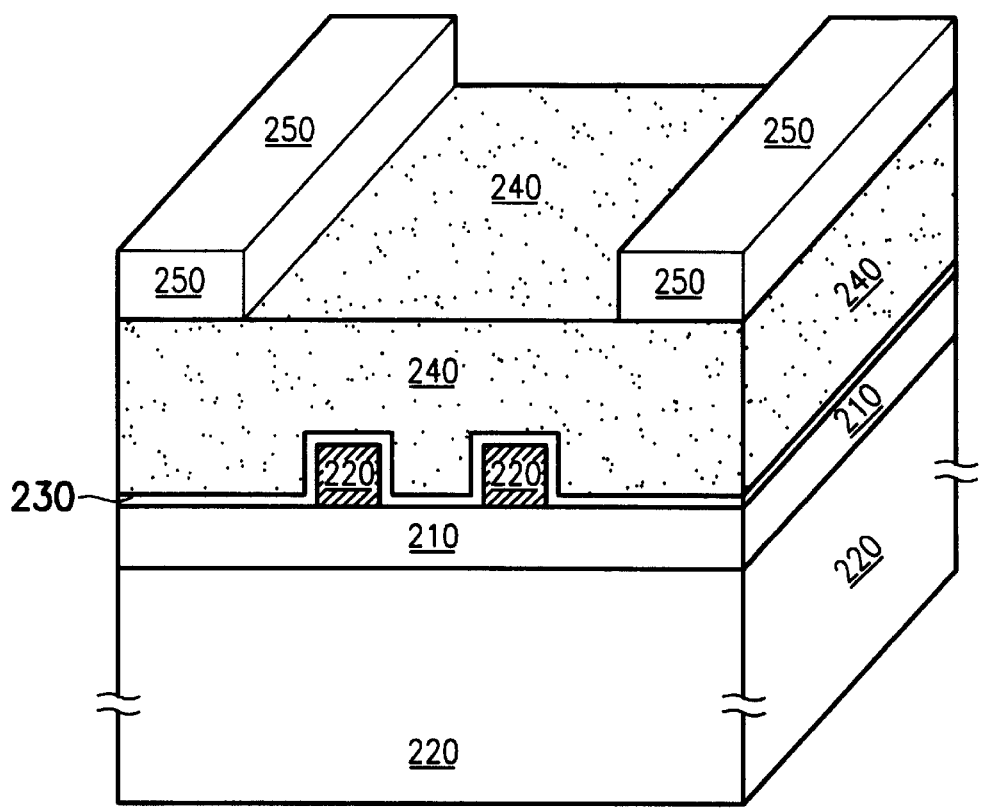
Figure 2D:
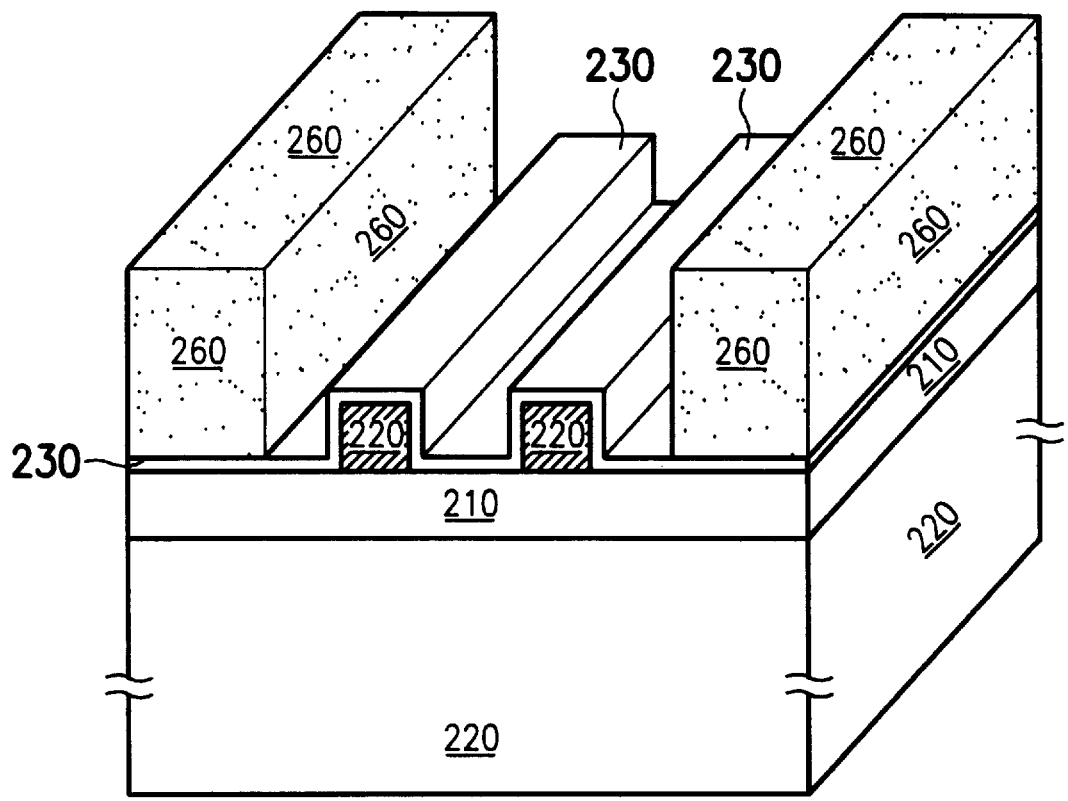
Figure 2E:
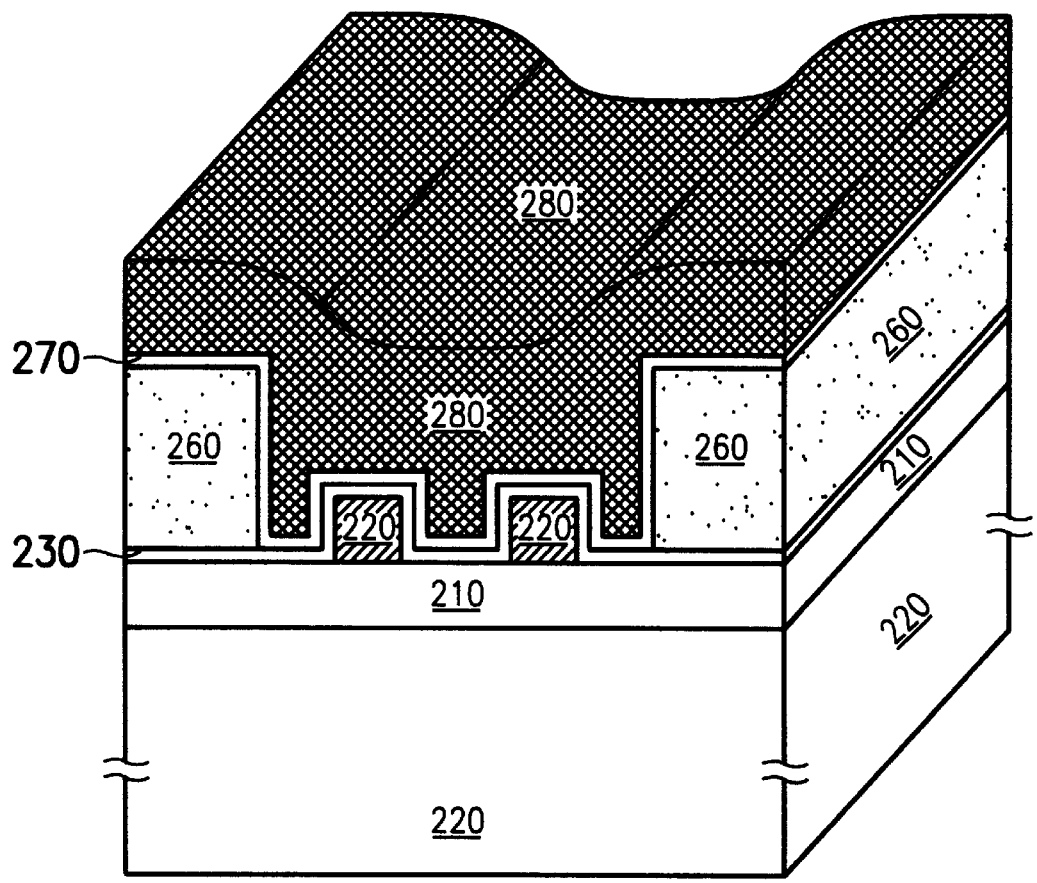

Referring to FIG. 2E, a CVD silicon nitride layer 230 was formed overlying interconnects 220 and BPSG 210 as a stop layer for the following etching process.

Referring to FIG. 2C, another BPSG layer 240 was formed over the silicon nitride layer 230, and a photoresist pattern layer 250 was formed over the BPSG layer 240 to define a bridge supporting structure.

Referring to FIG. 2D, using the photoresist pattern layer 250 as a mask, the exposed BPSG 240 was removed to the silicon nitride layer 230 by means of dry etching, and two bridge supporting structures 260 were formed beside the interconnects 220.

Referring to FIG. 2E, removing the photoresist pattern layer 250 was removed first, then another CVD silicon nitride layer 270 was formed overlying the silicon nitride layer 230 and the bridge supporting structures 260. Subsequently, a inter-metal dielectric layer 280, i.e. a BPSG layer, with a thickness greater than that of the bridge supporting structures 260, was formed over the silicon nitride layer 270. Then, a planarization treatment was applied by means of chemical mechanical polish (CMP) to remove excess BPSG layer 280 to the silicon nitride 270 on BPSG layer 240.

Figure 2F:
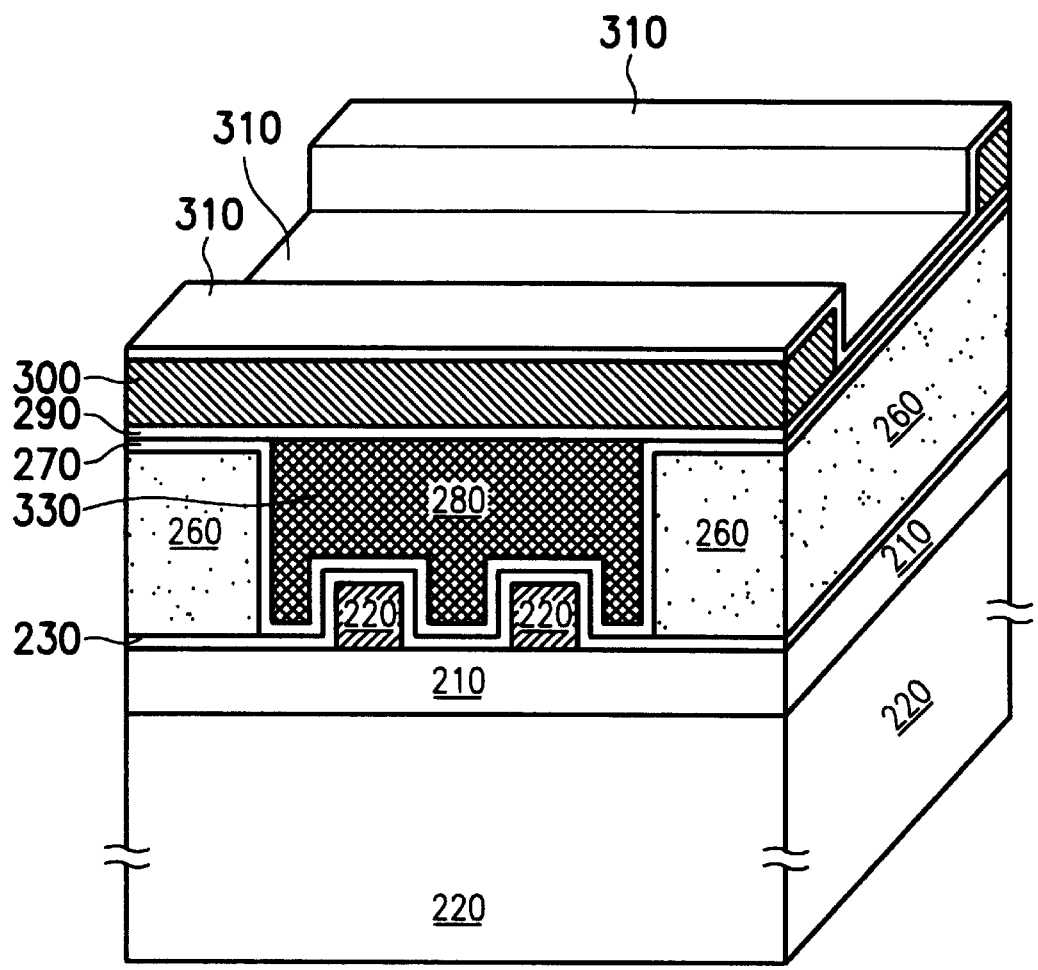

Referring to FIG. 2F, another silicon nitride layer 290 was formed over the planarized BPSG layer 280, and a plurality of interconnects 300 with an orientation crossing over the interconnects 220 were formed over the silicon nitride 290 by means of the traditional metallization process. Subsequently, a CVD silicon nitride was formed e., overlying the interconnects 300 and silicon nitride 290 as a passivation layer.

Figure 2G:
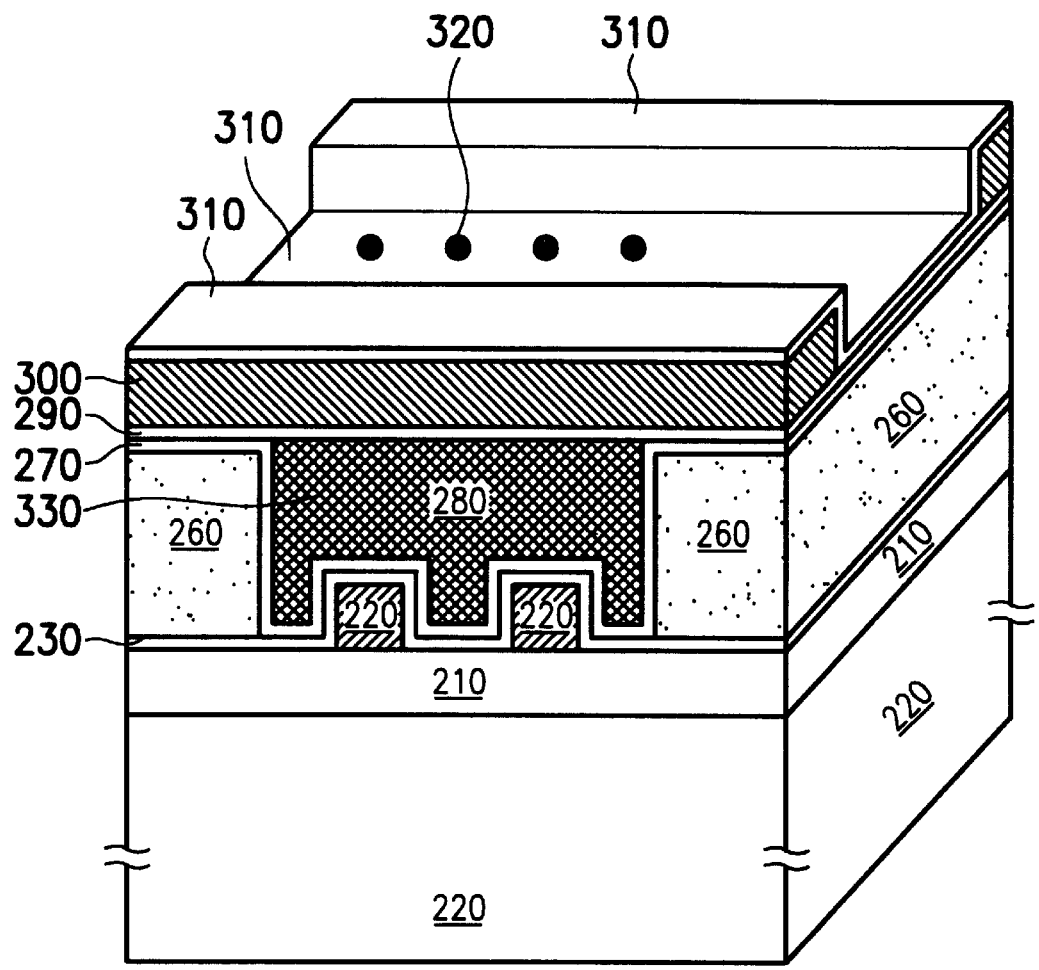
Figure 2H:
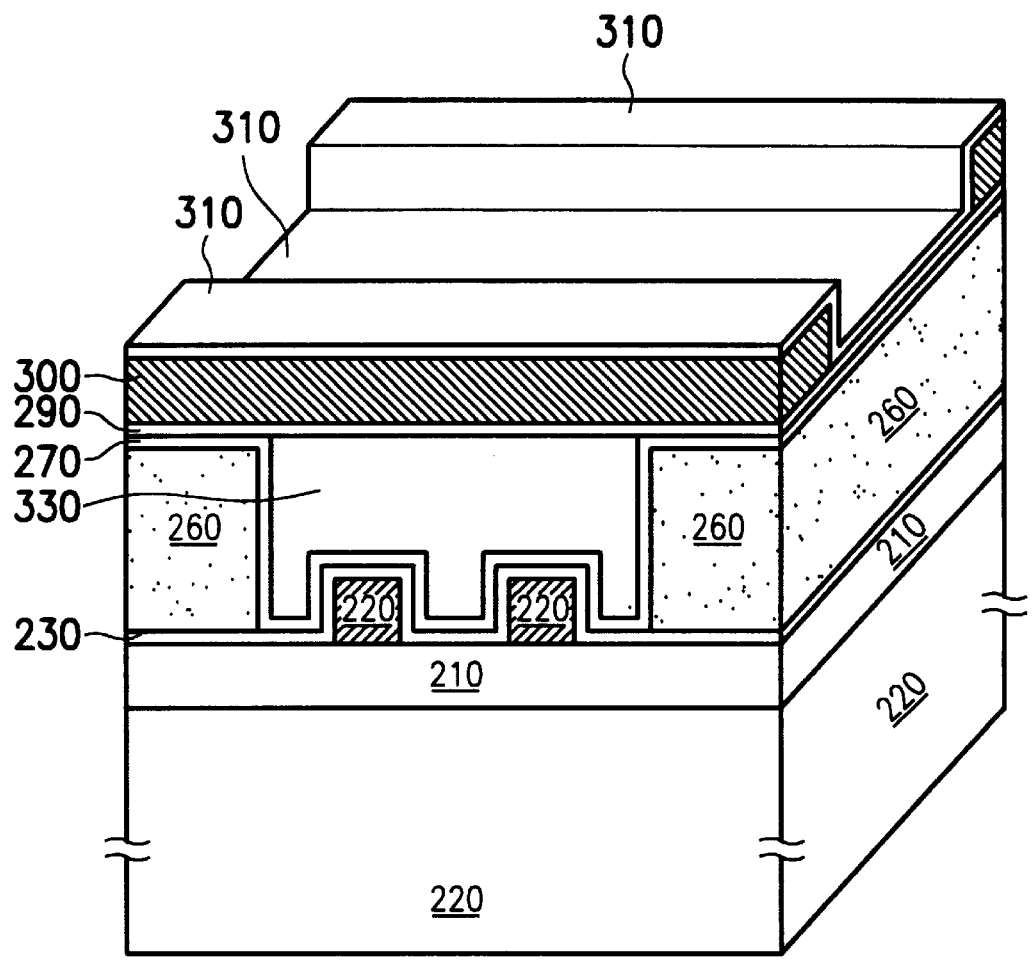

Referring to FIG. 2G, a plurality of channels 320 through the silicon nitride layer 310, silicon nitride layer 290, silicon nitride layer 270 and exposing the BPSG layer 280 were formed within the area between the two bridge supporting structure 260. The diameter of the channels depends on the line-width of the semiconductor devices, wherein the diameter of the channels in this embodiment is 0.2 $\mu$m. Subsequently, a suitable solvent (i.e. DHF), was directed into the channels 320 to dissolve the EPSG layer 280 completely and form a chamber 330 as shown in FIG. 2G. The previous BPSG layer 280 used as a inter-metal dielectric layer was replaced by air with a dielectric constant of 1.004, which is lower than any known low-k dielectric material.

Moreover, an extra drying treatment by means of high-temperature baking was applied to evaporate the moisture and solvent after the EPSG layer 240 was removed completely by DHF. Subsequently, the channels were sealed. Alternately, an extra inert gas, i.e. nitrogen or a noble gas, was introduced into the chamber 330 through the channels 320 after the drying treatment was applied by high-temperature baking. Finally, the channels were sealed according to the traditional process.

According to the method described above, the traditional low-k dielectric material was replaced by either air or an inert gas after the low-k dielectric material was removed completely by a suitable solvent, Thus, a novel dielectric layer with a dielectric constant of about 1 was obtained. The novel dielectric layer not only isolated the interconnects, but also reduced the RC-delay effect.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for isolating interconnects, the steps comprising:

providing a substrate;
forming a first insulating layer over the substrate;
forming a first interconnect over the first insulating layer;
forming a first stop layer overlying the first interconnect and the first insulating layer;
forming a second insulating layer over the first stop layer;
forming a photoresist pattern layer over the second insulating layer;
using the photoresist pattern layer as a mask and etching the exposed second insulating layer to the first stop layer to define two bridge-supporting structures beside the first interconnect;
forming a second stop layer overlying the first stop layer and the bridges supporting structure;
forming an intermetal-dielectric layer with a thickness greater than that of the bridge-supporting structures over the second insulating layer;
applying a planarization treatment by etching back the intermetal-dielectric layer to the second stop layer on the bridge-supporting structures;
forming a third stop layer over the inter-metal dielectric layer;
forming a second interconnect over the third stop layer, wherein the orientation of the second interconnect crosses over the first interconnect;
forming a passivation layer overlying the second interconnect and the third stop layer;
defining at least one channel through the passivation layer, the third stop layer, the second stop layer and exposing the inter-metal dielectric layer;
dissolving the inter-metal dielectric layer completely with a suitable solvent through the channel to form a chamber for isolating the first and second interconnects;
drying to evaporate water and solvent in the chamber; and
sealing the chamber.

2. The method as claimed in claim 1, wherein the first interconnect is selected from the group consisting of aluminum, copper, Al—Cu alloy and Al—Cu—Si alloy.

3. The method as claimed in claim 1, wherein the first insulating layer consists of silicon nitride.

4. The method as claimed in claim 1, wherein the second insulating layer consists of silicon nitride.

5. The method as claimed in claim 1, wherein the third insulating layer consists of silicon nitride.

6. The method as claimed in claim 1, wherein the passivation layer consists of silicon nitride.

7. The method as claimed in claim 1, wherein the first interconnect is selected from the group consisting of aluminum, copper, Al—Cu alloy and Al—Cu—Si alloy.

8. The method as claimed in claim 1, wherein the first insulating layer is selected from the group consisting of silicon oxide, TEOS, SOG, BPSG and PSG.

9. The method as claimed in claim 8, wherein the first insulating layer consists of BPSG.

10. The method as claimed in claim 1, wherein the second insulating layer is selected from the group consisting of silicon oxide, TEOS, SOG, BPSG and PSG.

11. The method as claimed in the 10, wherein the second insulating layer consists of BPSG.

12. The method as claimed in claim 1, wherein the inter-metal dielectric layer consists of a low-k dielectric material.

13. The method as claimed in claim 12, wherein the low-k dielectric material is selected from the group consisting of silicon oxide, TEOS, PSG, BPSG.

14. The method as claimed in claim 13, wherein the low k dielectric material consists of BPSG.

15. The method as claimed in claim 14, wherein the suitable solvent is DHF.

16. A method for isolating interconnects, the steps comprising:
providing a substrate;
forming a first insulating layer over the substrate;
forming a first interconnect over the first insulating layer;
forming a first stop layer overlying the first interconnect and the first insulating layer;
forming a second insulating layer over the first stop layer;
forming a photoresist pattern layer over the second insulating layer;
using the photoresist pattern layer as a mask and etching the exposed second insulating layer to the first stop layer to define two bridge-supporting structures beside the first interconnect;
forming a second stop layer overlying the first stop layer and the bridges supporting structure;
forming an intermetal-dielectric layer with a Thickness greater than that of the bridge-supporting structures over the second insulating layer;
applying a planarization treatment by etching back the intermetal-dielectric layer to the second stop layer on the bridge-supporting structures;
forming a third stop layer over the inter-metal dielectric layer;
forming a second interconnect over the third stop layer, wherein the orientation of the second interconnect crosses over the first interconnect;
forming a passivation layer overlying the second interconnect and the third stop layer;
defining at least one channel through the passivation layer, the third stop layer, the second stop layer and exposing the inter-metal dielectric layer;
dissolving the inter-metal dielectric layer completely with a suitable solvent through the channel to form a chamber for isolating the first and second interconnects;
drying to evaporate water and solvent in the chamber;
introducing an inert gas into the chamber; and
sealing the channel.

17. A method for isolating interconnects, the steps comprising:
providing a substrate;
forming a first insulating layer over the substrate;
forming a first interconnect over the first insulating layer;
forming a first stop layer overlying the first interconnect and the first insulating layer;
forming a second insulating layer over the first stop layer;
forming a photoresist pattern layer over the second insulating layer;
using the photoresist pattern layer as a mask and etching the exposed second insulating layer to the first stop layer to define two bridge-supporting structures beside the first interconnect;
forming a second stop layer overlying the first stop layer and the bridge-supporting structures;
forming an intermetal-dielectric layer with a thickness greater than that of the bridge-supporting structures over the second insulating layer;
applying a planarization treatment by etching back the intermetal-dielectric layer to the second stop layer on the bridge-supporting structures;

forming a third stop layer over the inter-metal dielectric layer;

forming a second interconnect over the third stop layer, wherein the orientation of the second interconnect crosses over the first interconnect;

forming a passivation layer overlying the second interconnect and the third stop layer;

defining at least one channel through the passivation layer, the third stop layer, the second stop layer and exposing the inter-metal dielectric layer;

dissolving the inter-metal dielectric layer completely with a suitable solvent through the channel to form a chamber for isolating the first and second interconnects;

drying to evaporate water and solvent in the chamber;

introducing nitrogen gas or noble gas into the chamber; and sealing the channel.

* * * * *